(12) United States Patent  (10) Patent No.: US 7,729,122 B2
Wong  (45) Date of Patent: Jun. 1, 2010

(54) FASTENER FOR HEAT SINKS

(75) Inventor: Chong B. Wong, Vernon Hills, IL (US)

(73) Assignee: Illinois Tool Works Inc., Glenview, IL (US)

( * ) Notice: Subject to any disclaimer, the term of this patent is extended or adjusted under 35 U.S.C. 154(b) by 150 days.

(21) Appl. No.: 11/871,191

(22) Filed: Oct. 12, 2007

(65) Prior Publication Data
US 2008/0284005 A1 Nov. 20, 2008

(30) Foreign Application Priority Data
Oct. 13, 2006 (TW) ............... 095218107
Nov. 9, 2006 (TW) ............... 095219821

(51) Int. Cl.
H05K 7/20 (2006.01)
(52) U.S. Cl. .................. 361/710; 361/709; 361/719; 361/679.54
(58) Field of Classification Search ................. 361/719, 361/709, 710, 679.54; 257/727
See application file for complete search history.

(56) References Cited
U.S. PATENT DOCUMENTS

| 6,304,452 | B1 * | 10/2001 | Lo | 361/704 |
|---|---|---|---|---|
| 6,307,748 | B1 * | 10/2001 | Lin et al. | 361/704 |
| 6,331,937 | B1 * | 12/2001 | Bartyzel | 361/679.54 |
| 6,475,030 | B1 * | 11/2002 | Chang | 439/557 |
| 6,545,879 | B1 * | 4/2003 | Goodwin | 361/807 |
| 6,557,675 | B2 * | 5/2003 | Iannuzzelli | 188/380 |
| 6,679,712 | B2 * | 1/2004 | Chang | 439/248 |
| 6,697,256 | B1 * | 2/2004 | Horng et al. | 361/704 |
| 6,786,691 | B2 * | 9/2004 | Alden, III | 411/371.2 |
| 6,826,054 | B2 * | 11/2004 | Liu | 361/719 |
| 6,930,884 | B2 * | 8/2005 | Cromwell et al. | 361/710 |
| 7,042,727 | B2 * | 5/2006 | Ulen et al. | 361/704 |
| 7,116,556 | B2 * | 10/2006 | Lee et al. | 361/704 |
| 7,126,823 | B2 * | 10/2006 | Chen et al. | 361/702 |
| 7,161,808 | B2 * | 1/2007 | Atkinson | 361/719 |
| 7,167,370 | B2 * | 1/2007 | Lee et al. | 361/719 |
| 7,180,743 | B2 * | 2/2007 | Chen et al. | 361/704 |
| 7,209,354 | B2 * | 4/2007 | Wu et al. | 361/697 |
| 7,342,796 | B2 * | 3/2008 | Aukzemas | 361/719 |
| 7,359,200 | B2 * | 4/2008 | Zhou et al. | 361/704 |
| 7,430,122 | B2 * | 9/2008 | Li | 361/719 |
| 7,474,530 | B2 * | 1/2009 | Stewart et al. | 361/704 |
| 7,474,532 | B1 * | 1/2009 | Desrosiers et al. | 361/719 |
| 7,576,989 | B2 * | 8/2009 | Li et al. | 361/719 |
| 2004/0105236 | A1 * | 6/2004 | Lee et al. | 361/704 |

(Continued)

Primary Examiner—Anatoly Vortman
(74) Attorney, Agent, or Firm—Lowe Hauptman Ham & Berner LLP

(57) ABSTRACT

A fastener includes a rod and a sleeve. The rod has a flat top for depression and a rod body extending downwardly from the flat top. The upper end of the rod body is provided with a circular groove. The sleeve is formed with a through hole and a flange close to its upper end. The inner side of the sleeve is provided above the flange with a first engaging section engageable with the circular groove of the rod. The sleeve is provided with a second engaging section below the flange and a third engaging section at the lower end thereof. By means of the engagement between the circular groove of the rod and the first engaging section of the sleeve, the rod will be prevented from detaching from the sleeve. The second and third engaging sections are used for preventing the fastener from disengaging from a workpiece.

20 Claims, 10 Drawing Sheets

U.S. PATENT DOCUMENTS

2004/0253077 A1* 12/2004 Aoki et al. ................. 411/508
2006/0007659 A1* 1/2006 Lee et al. ................... 361/704
2006/0275100 A1* 12/2006 Aukzemas ................. 411/353
2007/0217159 A1* 9/2007 Long et al. ................. 361/704

* cited by examiner

FASTENER FOR HEAT SINKS

RELATED APPLICATIONS

The present application is based on, and claims priority from, Chinese Application Number 200610146332 filed Nov. 9, 2006; Taiwanese Application Number 095219821 filed Nov. 9, 2006 and Taiwanese Application Number 095218107 filed Oct. 13, 2006, the disclosures of which are hereby incorporated by reference herein in their entirety.

TECHNICAL FIELD OF THE INVENTION

This invention is related to a structure of a fastener for heat sinks, and in particular to one which can be easily engaged with a heat sink, but will not be easily disengaged therefrom.

DESCRIPTION OF THE PRIOR ART

Recently, high tech electronic industries play the major role in the market. With the popularity of computers, a lot of data management must rely on the computer to achieve the process accurately and rapidly. However, as the CPU will generate much heat in operation, a heat sink must be mounted on the CPU in order to dissipate the heat evolved from the CPU and a fan is used to exhaust the heat out of the computer.

As shown in FIG. 1, the conventional fastener 1 for mounting a heat sink on a CPU comprises a rod 11 and a sleeve 12.

The rod 11 has a pressing section 111 which is provided with a cutting angle 1111 at the lower end of two sides thereof. From the pressing section 111 extends downwardly a rod body 112 which is provided with a circular groove 113 and a hook 114 below the circular groove 113.

The sleeve 12 has a flange 121 at the top and a center through hole 122 which has a diameter dimensioned to receive the rod body 112. The sleeve 12 is formed with two slots 123 at two opposite sides thereof. The outer side of the sleeve 12 has a circular groove 124 which acts as an engaging section. Under the circular groove 124 there is a conical bearing section 125. The conical bearing section 125 has a hollow interior which is communicated with the center through hole 122 of the sleeve 12. The center through hole 122 of the sleeve 12 has a flange 126 close to the conical section 125 and adapted to engage with the circular groove 113 of the rod 11.

When in use (see FIG. 2), the sleeve 12 is first inserted into the hole of the CPU 2 and the heat sink 3. As the bearing section 125 is conical in shape, the sleeve 12 will be easily inserted into the hole of the CPU 2 and the heat sink 3. In the meantime, the circular groove 124 of the sleeve 12 is engaged with the hole of the CPU 2, and the flange 121 of the sleeve 12 rests on the top of the heat sink 3. Then, the rod 11 is inserted into the center through hole 122 of the sleeve 12. When the rod 11 is pressed, the hook 114 of the rod 11 will pass through the flange 126 of the sleeve 12 and engaged with the lower edge of the flange 126 thereby engaging the CPU with the heat sink 3.

Although the conventional fastener 1 can achieve the purpose of engaging the CPU 2 with the heat sink 3, it suffers from the following drawback. Since the outer diameter of the sleeve 12 is adapted to the hole of the CPU 2 and the heat sink 3 and the bearing section 125 is integral with the sleeve 12, it will be difficult to force open the slot 123 of the sleeve 12 when the rod 11 is inserted into the through hole 122 of the sleeve 12. Hence, it is necessary to exert a comparatively large force to insert the rod 11 into the through hole 122 of the sleeve 12 thus requiring longer time for assembly. When the sleeve 12 is made from injection molding, the inner wall of the through hole 122 will become uneven due to expansion under hot condition and contraction under cold condition. As a consequence, the through hole 122 will not be an exact circle so that the rod 11 cannot be inserted vertically into the sleeve 12. Further, the inner diameter of the flange 126 of the sleeve 12 is generally slightly smaller than the largest outer diameter of the hook 114 of the rod 11 for making it easier to insert the rod 11 into the sleeve 12. As the computer will produce vibration in operation, the rod 11 will often be disengaged from the through hole 122 of the sleeve 12 thus disengaging the heat sink 3 from the CPU 2.

In view of the above-mentioned drawbacks of the conventional fastener 1, it is an object of the present invention to enable a rod to be easily inserted into the sleeve and difficult to be disengaged from the sleeve after assembly.

SUMMARY OF THE INVENTION

The primary object of the present invention is to prevent a heat sink from detaching from a CPU due to the fact that the rod will disengage from a sleeve by vibration produced during the operation of a computer.

Accordingly, the present invention provides a fastener for heat sinks, which includes a rod and a sleeve, wherein the rod has a top for depression and a rod body extends downwardly to form three stepped gradually decreasing portions, the upper end of the rod body is provided with a circular groove, the sleeve has a through hole and a flange at the upper end, a first engaging section is provided above the flange and engageable with the circular groove of the rod for preventing the rod from disengaging from the sleeve, a second engaging section and a third engaging section are arranged on the sleeve for providing a restricting force to the CPU and the heat sink thereby fastening the heat sink on the second engaging section of the sleeve, the second portion of the rod body being used for expanding the lower end of the sleeve to prevent the fastener from detaching from the heat sink.

It is another object of the present invention to overcome the drawback of conventional fastener of which the rod cannot expand the through hole of the sleeve when inserted into the sleeve and requires a relatively large force to insert the rod into the through hole of the sleeve thereby requiring more time for the assembly.

As such, the present invention provides a fastener for heat sinks which includes a rod and a sleeve, wherein the rod has a three stepped gradually decreasing portions for facilitating its insertion into the sleeve thus providing a firm positioning of the sleeve and therefore facilitating the assembly.

It is still another object of the present invention to overcome the drawback that the inner wall of the sleeve will become uneven due to expansion under hot condition and contraction under cold condition thereby making the through hole unable to be exactly circular and therefore making the rod unable to be vertically inserted into the sleeve.

It is a further object of the present invention to provide a fastener for heat sinks, wherein the inner wall of the through hole of the sleeve is provided with at least three projections which are exactly circular in shape so that when the rod is inserted to the sleeve, the rod will be guided into a vertical condition thereby preventing the rod 42 from moving sideward.

DETAILED DESCRIPTION OF THE PREFERRED EMBODIMENT

Figure 1:
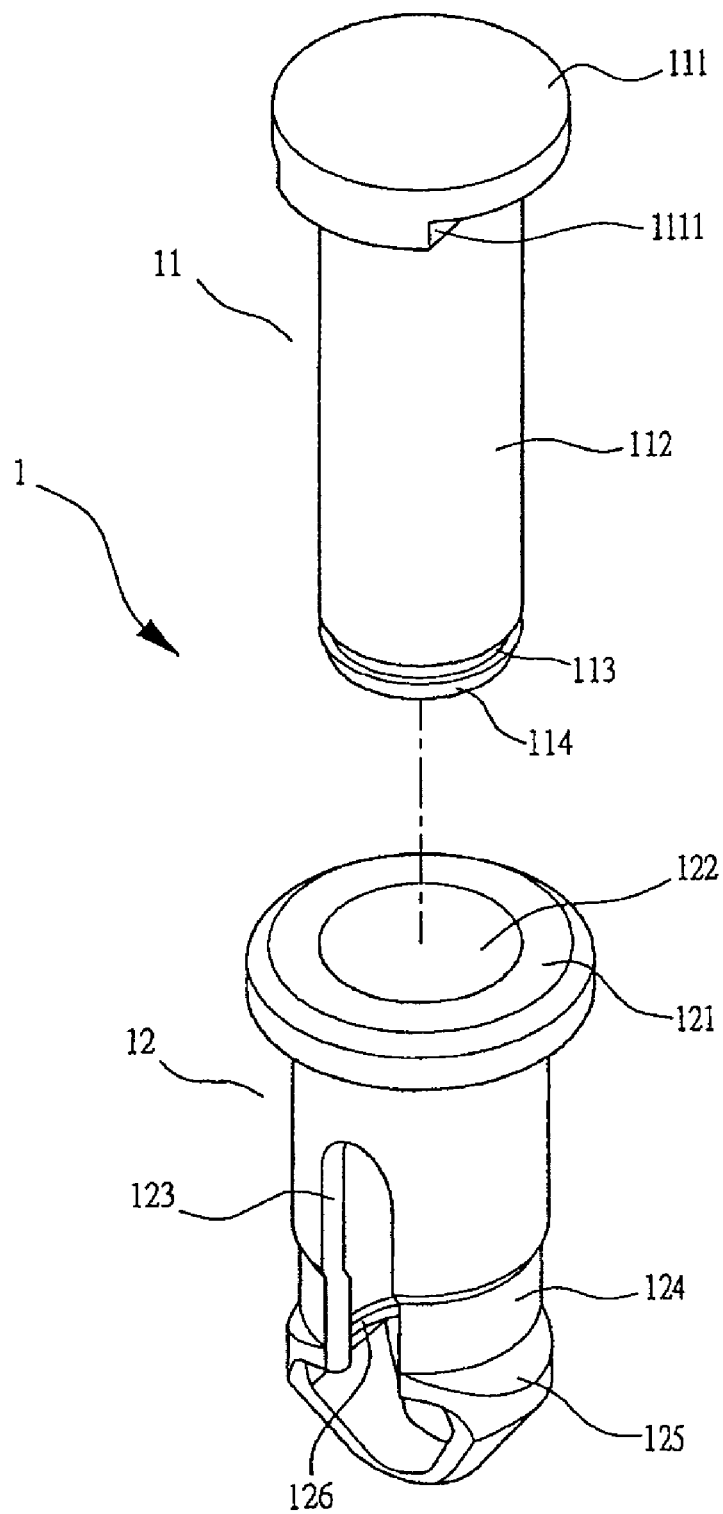
FIG. 1 is an exploded perspective view of a conventional fastener.
Figure 2:
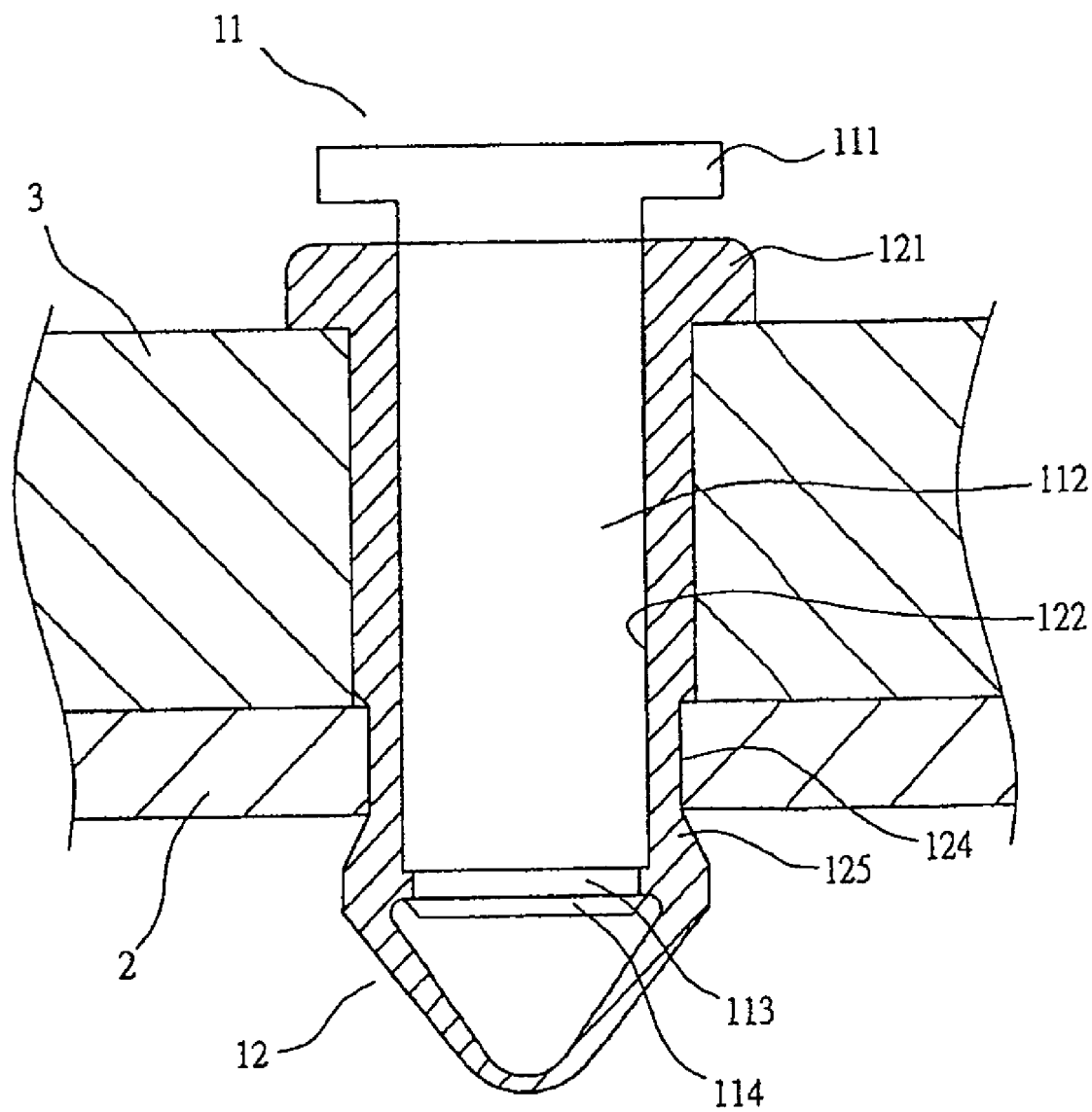
FIG. 2 is a sectional view of the conventional fastener.
Figure 3:
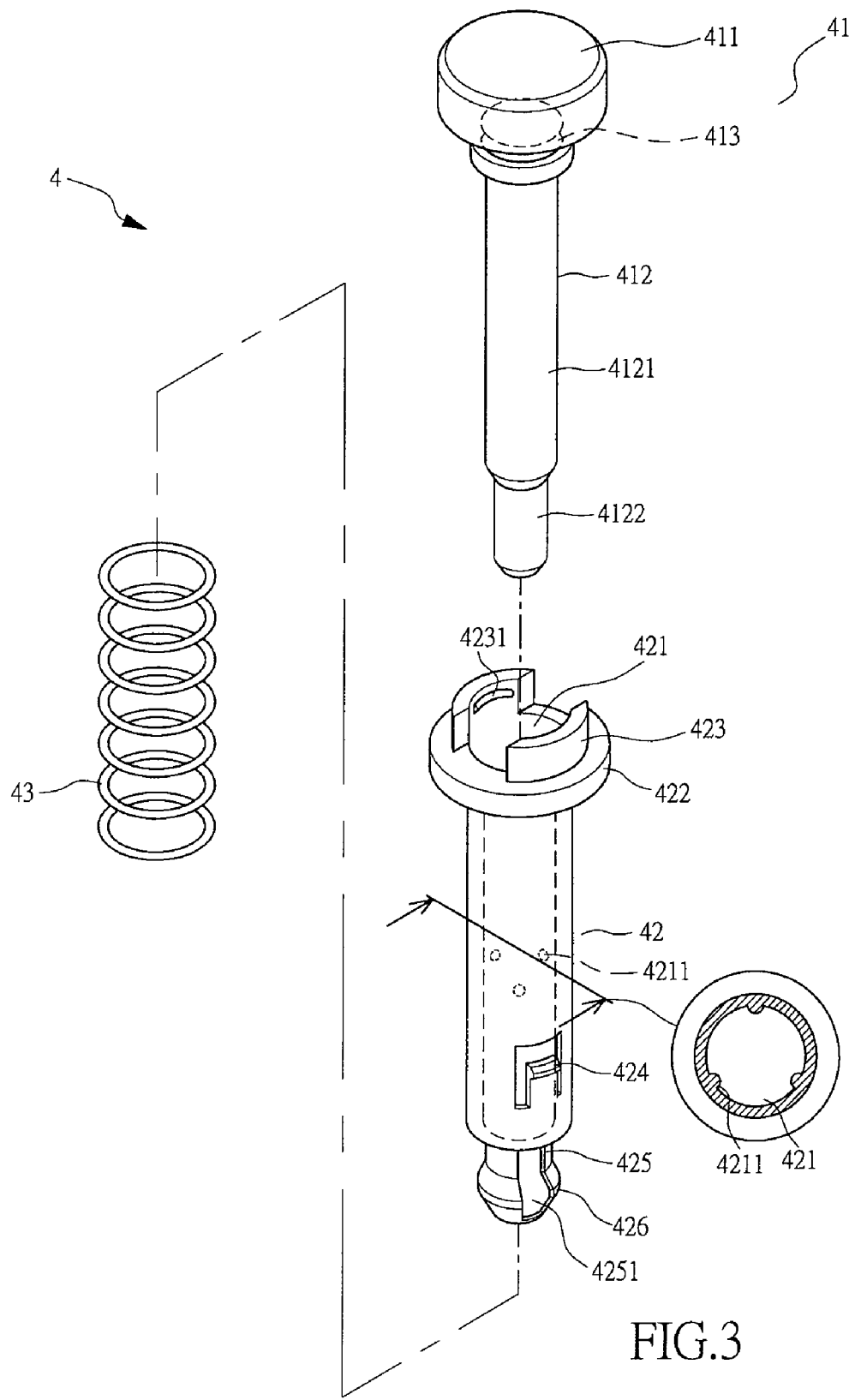
FIG. 3 is an exploded perspective view of a fastener according to the present invention.
Figure 4:
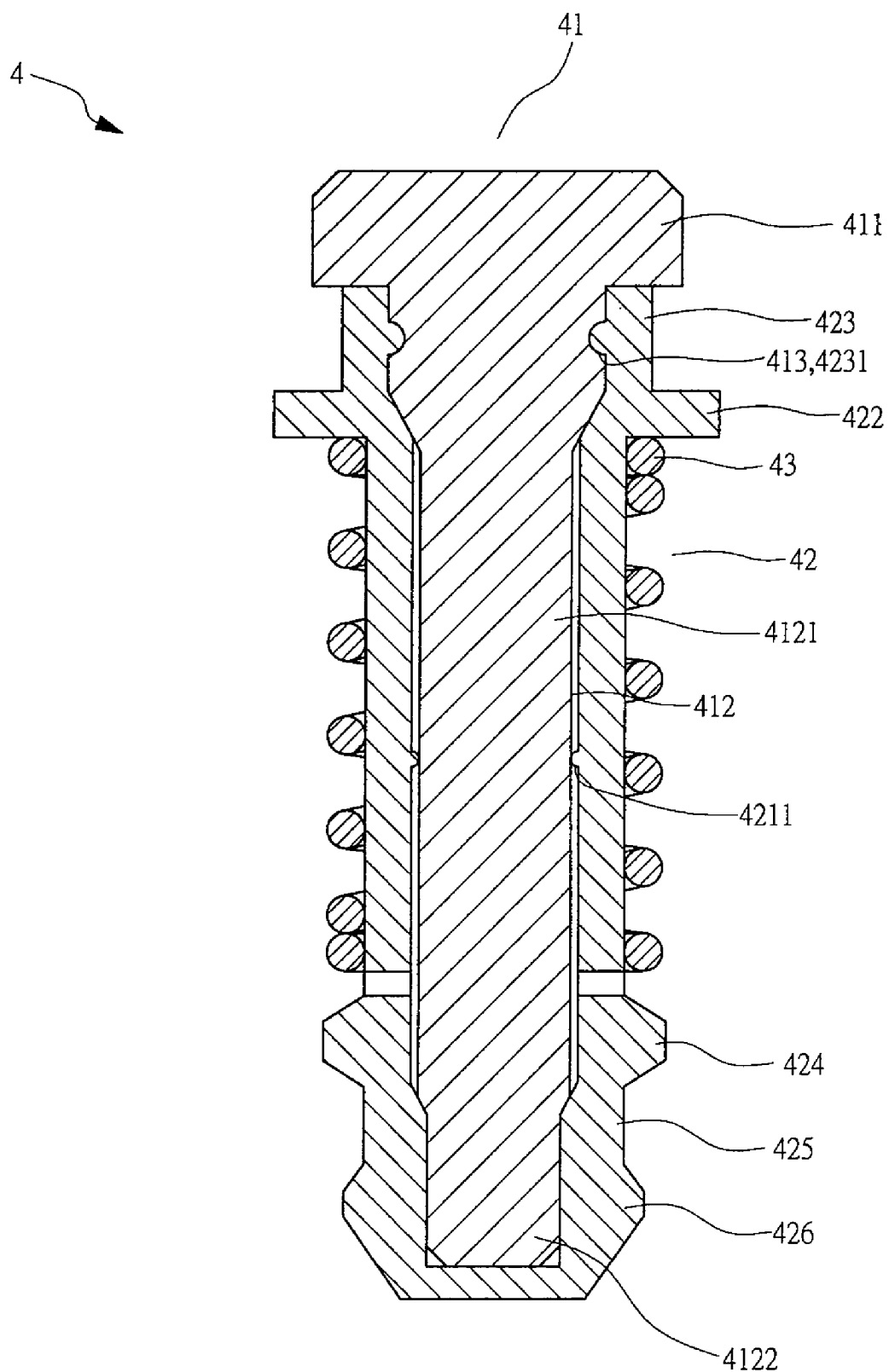
FIG. 4 is a sectional view of the fastener according to the present invention.

Referring to FIGS. 3 and 4, the fastener for heat sinks according to the present invention at least comprises a rod 41 and a sleeve 42.

The rod 41 has a top provided with a flat pressing section 411, and a rod body 412 extending downwardly from the pressing section 411. The rod body 412 is formed with three sections. The upper end of the rod body 412 has a circular engaging groove 413.

The sleeve 42 has longitudinal through hole 421 and a flange 422 close to its upper end. On the flange 422 there is a pair of opposite lugs 423 each having a first engaging member 4231 at the inner side adapted to engage with circular engaging groove 413 of the rod 41. The sleeve 42 is provided on the outer surface with a second engaging member 424 below the flange 422. The second engaging member 424 is a resilient projection. Below the second engaging member 424 there is an engaging recess 425 provided with two open slots 4251 at two opposite sides. Below the engaging recess 425 is a third engaging member 426 which is a gradually decreasing conical body. The third engaging member 426 utilizes the through hole 421 and the open slot 4251 to provide resiliency. The inner wall of the through hole 421 of the sleeve 42 is provided with at least three projections 4211 which may be an exact circular member. A resilient member 43 is put over the sleeve 42.

Figure 5:
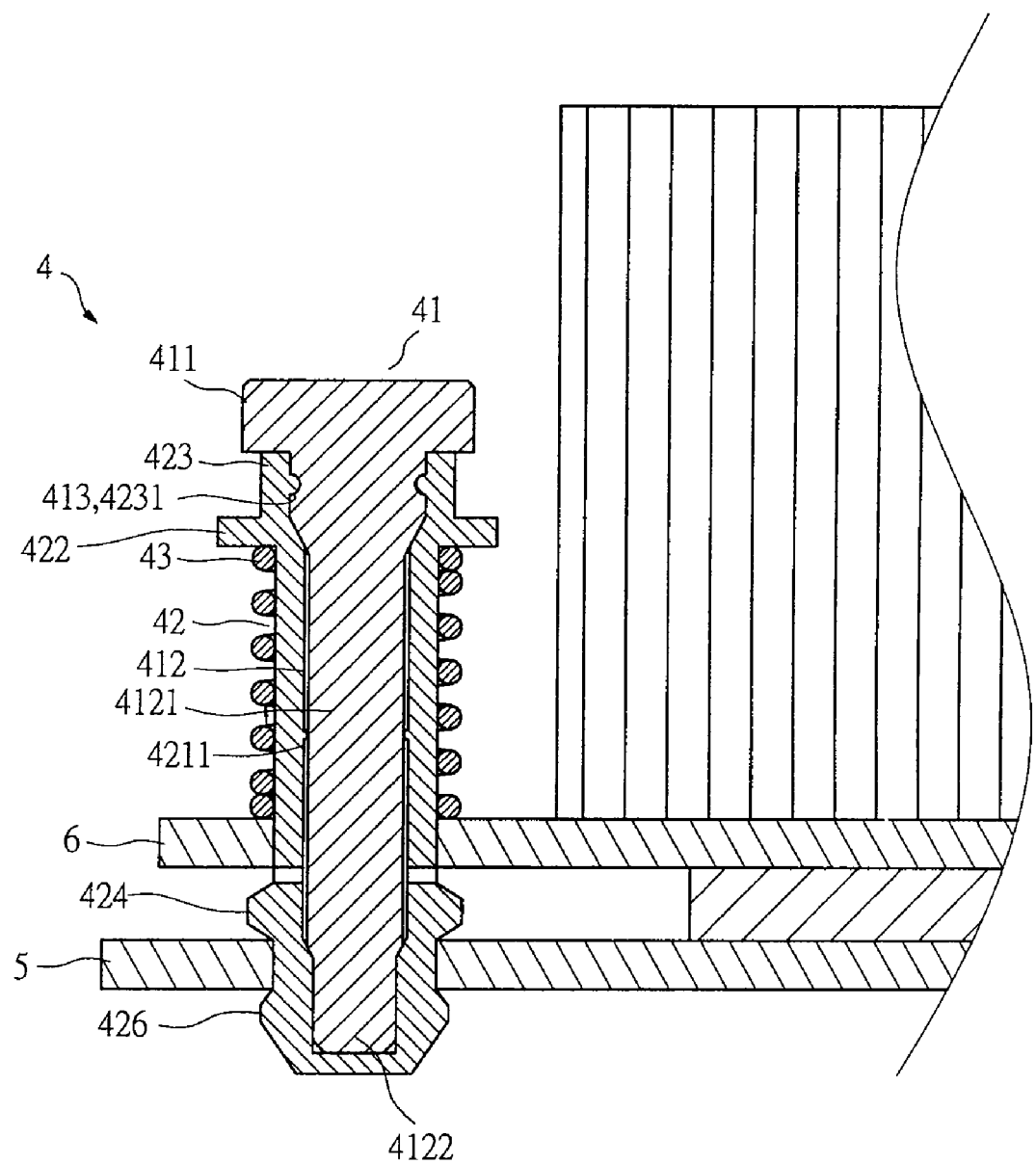
FIG. 5 is a working view of the fastener according to the present invention.

When in use (see FIG. 5), the sleeve 42 is first inserted into the hole of a CPU 5 and a heat sink 6. By means of the through hole 421 which has a conical bottom, the sleeve 42 can be easily inserted into the hole of the CPU 5 and the heat sink 6. In the meantime, the engaging recess 425 of the sleeve 42 is engaged with the hole of the CPU 5. The second engaging member 424 uses its resiliency to go through the hole of the CPU 5 to position between the CPU 5 and the heat sink 6. The resilient member 43 is fitted between the heat sink 6 and the flange 422 of the sleeve 42. By means of the resiliency of the resilient member 43, the sleeve 42 will exert a force on the CPU 5 and the heat sink 6. Then, the rod 41 is inserted into the through hole 421 from the opening at the top of the flange 422. When the rod 41 is forced to go downwardly, the rod body 412 of the rod 41 will easily go into the hole 421 of the sleeve 42. When the pressing section 411 of the rod 41 is pressed, the first engaging member 423 of the sleeve 42 will be engaged with the circular engaging groove 413 of the rod 41 and the CPU 5 will be engaged with the third engaging member 426 of the sleeve 42. By means of the second portion 4121 of the rod body 412, the lower end of the sleeve 42 will be forced to expand outwardly thereby firmly positioning the sleeve 42 and thereby preventing the rod 41 from disengaging from the sleeve 42. As a consequence, the CPU 5 and the heat sink 6 can be joined together.

The present invention utilizes the first engaging section 4231 arranged at the top of the sleeve 42 and configured to engage the engaging groove 413 of the rod 41 to prevent the rod 41 from disengaging from the sleeve 42. Further, the present invention utilizes the second and third engaging sections 424 and 426 to providing a restricting force to the CPU 5 and the heat sink 6 thereby fastening the heat sink 6 on the second engaging section 425 of the sleeve 42, and makes use of the second portion 4121 of the rod body 412 to expand the lower end of the sleeve 42 to prevent the fastener 4 from detaching from the heat sink 6. Moreover, the rod body 412 has three gradually decreasing portions and can be easily inserted into the sleeve 42 to keep the sleeve 42 at a firm position thus facilitating the engagement of the fastener 4. Finally, as the inner wall of the through hole 421 of the sleeve 42 is provided with at least three projections 4211 which may be an exact circular member, when the rod 41 is inserted into the sleeve 42, the projections 4211 will keep the rod 41 at a vertical condition thereby preventing the rod 41 from moving sideward and providing smooth engagement between the rod 41 and the sleeve 42.

Figure 6:
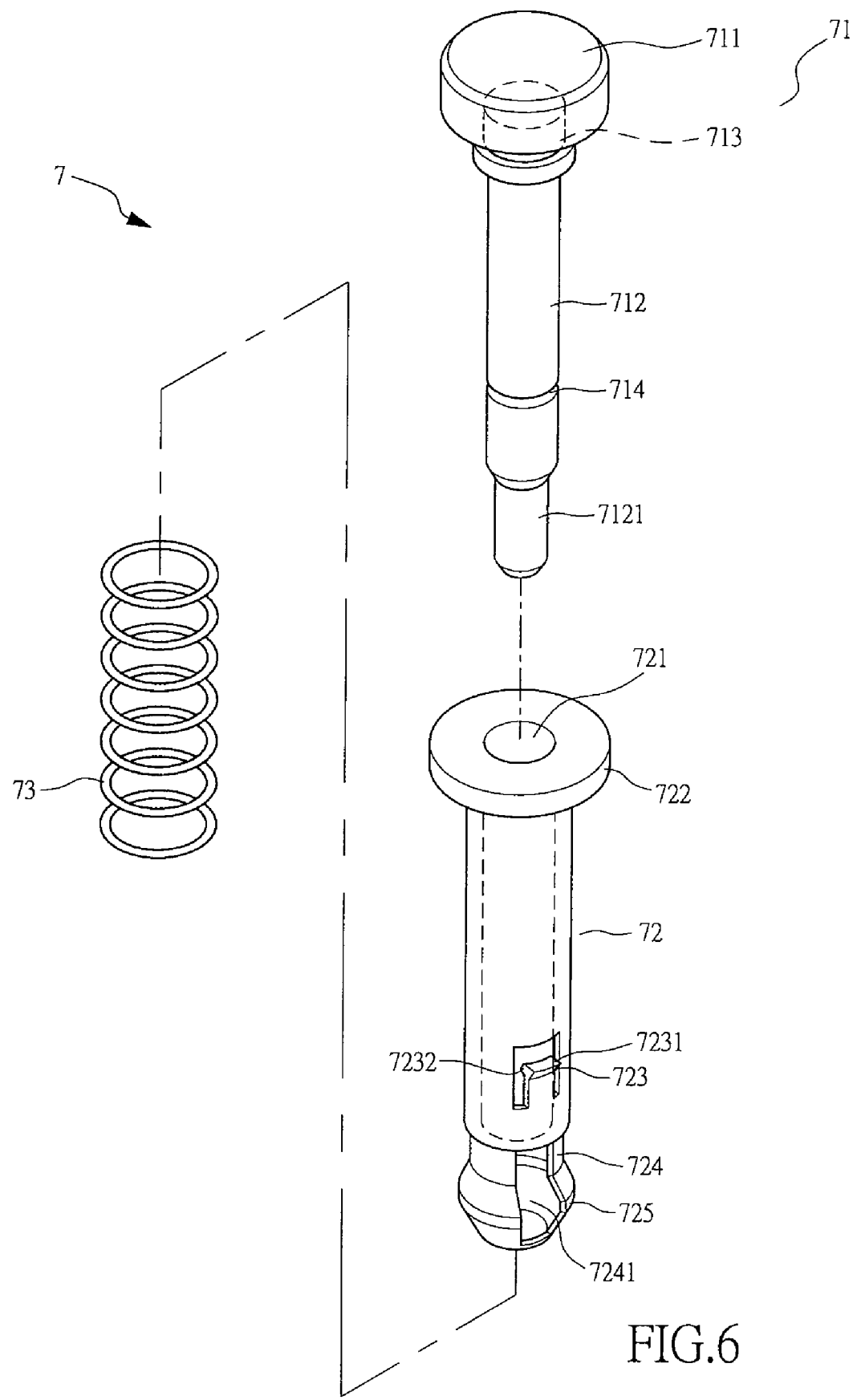
FIG. 6 is an exploded perspective view of a fastener according to a second embodiment of the present invention.

Referring to FIG. 6, there is shown another embodiment of the present invention. As shown, the fastener 7 comprises at least a rod 71 and a sleeve 72.

The rod 71 has a top provided with a flat pressing section 711, and a rod body 712 extending downwardly from the pressing section 711. The rod body 712 is formed with two sections. The upper end of the rod body 712 has a circular engaging groove 713 and the lower end of the rod body 712 is formed with a circular groove 714.

The sleeve 72 has longitudinal through hole 721 and a flange 722 close to its upper end. The sleeve 72 is provided on the outer surface with a first engaging member 723 below the flange 722. The first engaging member 723 is an inverted conical projection member with resiliency. The upper end of the first engaging member 723 has a bearing section 7231. The inner side of the bearing section 7231 has a protuberance 7232 corresponding to the circular groove 714. Below the first engaging member 723 there is an engaging recess 724 provided with at two opposite sides with two open slots 7241. Below the engaging recess 724 is a second engaging member 725 which is a gradually decreasing conical body. The second engaging member 725 utilizes the through hole 721 and the open slot 7241 to provide resiliency. A resilient member 73 is put over the outer side of the sleeve 72.

Figure 7:
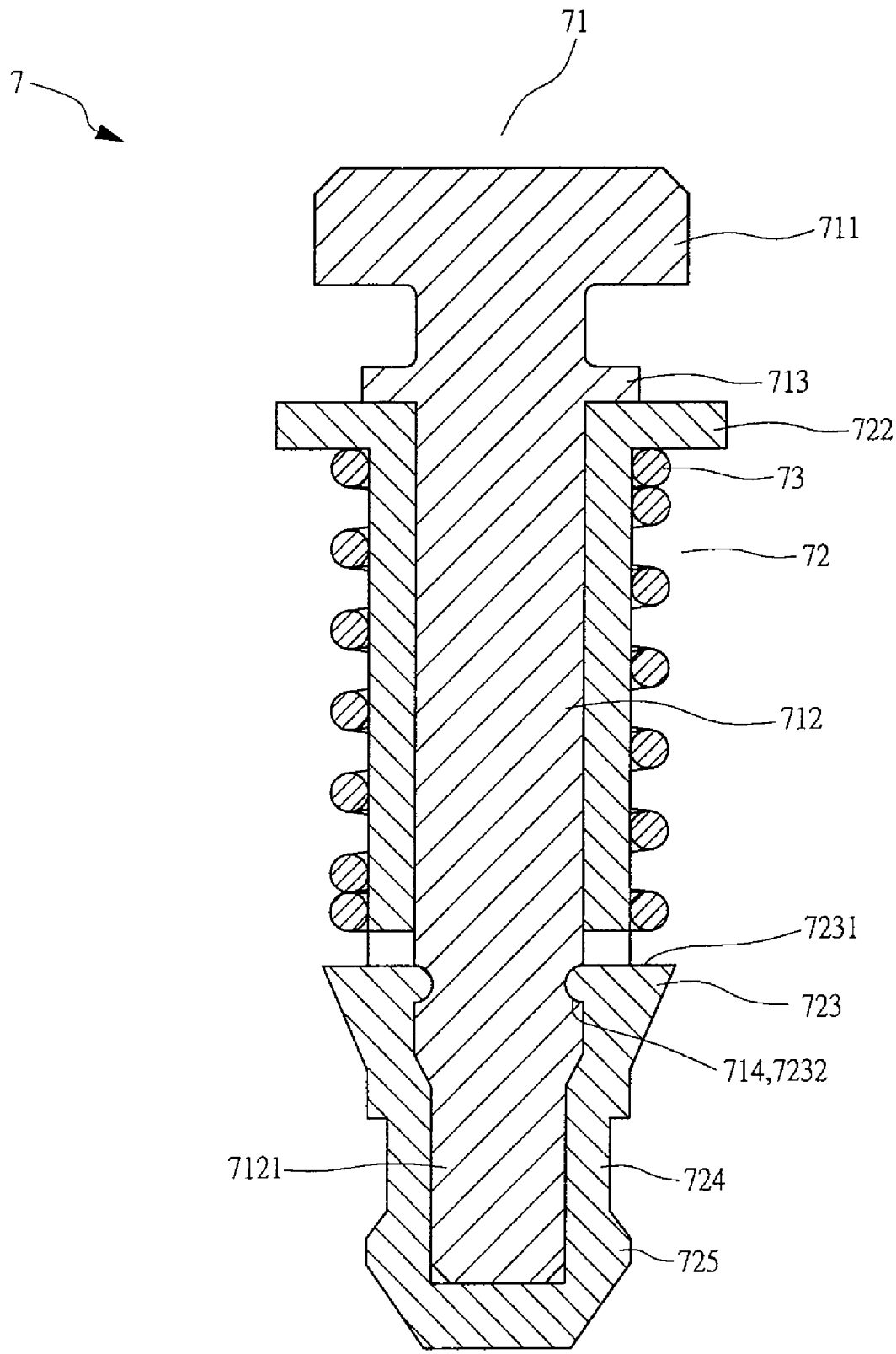
FIG. 7 is a sectional view of the fastener according to the second embodiment of the present invention.
Figure 8:
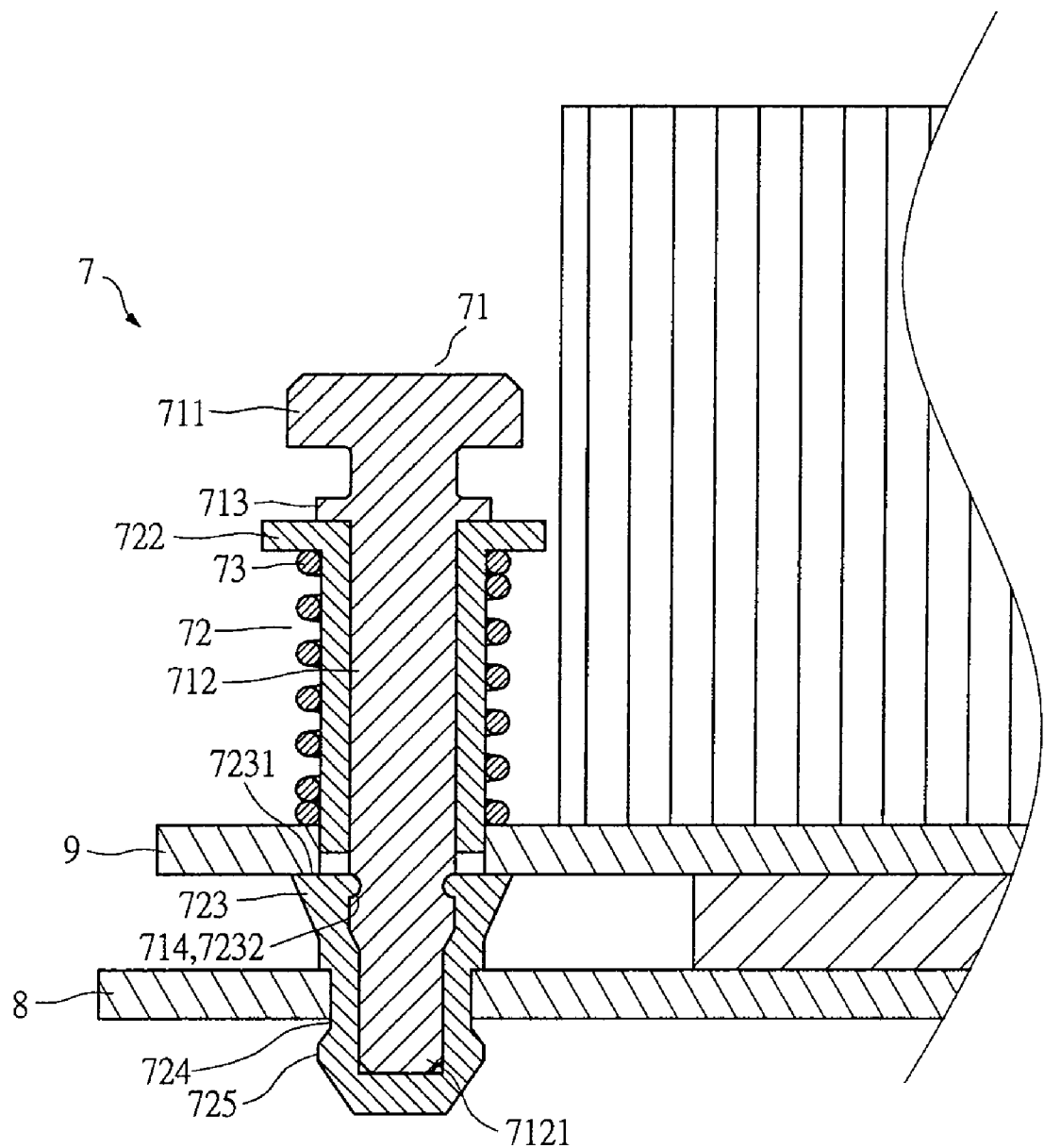
FIG. 8 is a working view of the fastener according to the second embodiment of the present invention.

When in use (see FIG. 7), the sleeve 72 is first inserted into the hole of a CPU 8 and a heat sink 9. By means of the through hole 721 of the sleeve 72 which has a conical bottom, the sleeve 72 can be easily inserted into the hole of the CPU 8 and the heat sink 9. In the meantime, the engaging recess 724 of the sleeve 72 is engaged with the hole of the CPU 8. The bearing section 7231 of the first engaging member 723 bears against the bottom of the heat sink 9. The resilient member 73 is fitted between the heat sink 9 and the flange 722 of the sleeve 72. By means of the resiliency of the resilient member 73, the sleeve 72 will exert a force on the CPU 8 and the heat sink 9. Then, the rod 71 is inserted into the through hole 721 from the opening at the top of the flange 722 of the sleeve 72. When the rod 71 is forced to go downwardly, the rod body 712 of the rod 71 will easily go into the hole 721 of the sleeve 72. When the pressing section 711 of the rod 71 is pressed, the protuberance 7232 of the first engaging member 723 of the sleeve 72 will be engaged with the circular engaging groove 714 of the rod 71 and the CPU 8 will be engaged with the second engaging member 725 of the sleeve 72. By means of the second portion 7121 of the rod body 712, the lower end of the sleeve 72 will be forced to expand outwardly thereby firmly positioning the sleeve 72 and thereby preventing the rod 71 from disengaging from the sleeve 72. As a consequence, the CPU 8 and the heat sink 9 can be joined together. By means of the engagement between the first engaging member 723 and the circular groove 714, the rod 71 will be prevented from disengaging from the sleeve 72 though subject to the vibration produced in the operation of the CPU 8 thereby firmly positioning the rod 71 in the sleeve 72.

Figure 9:
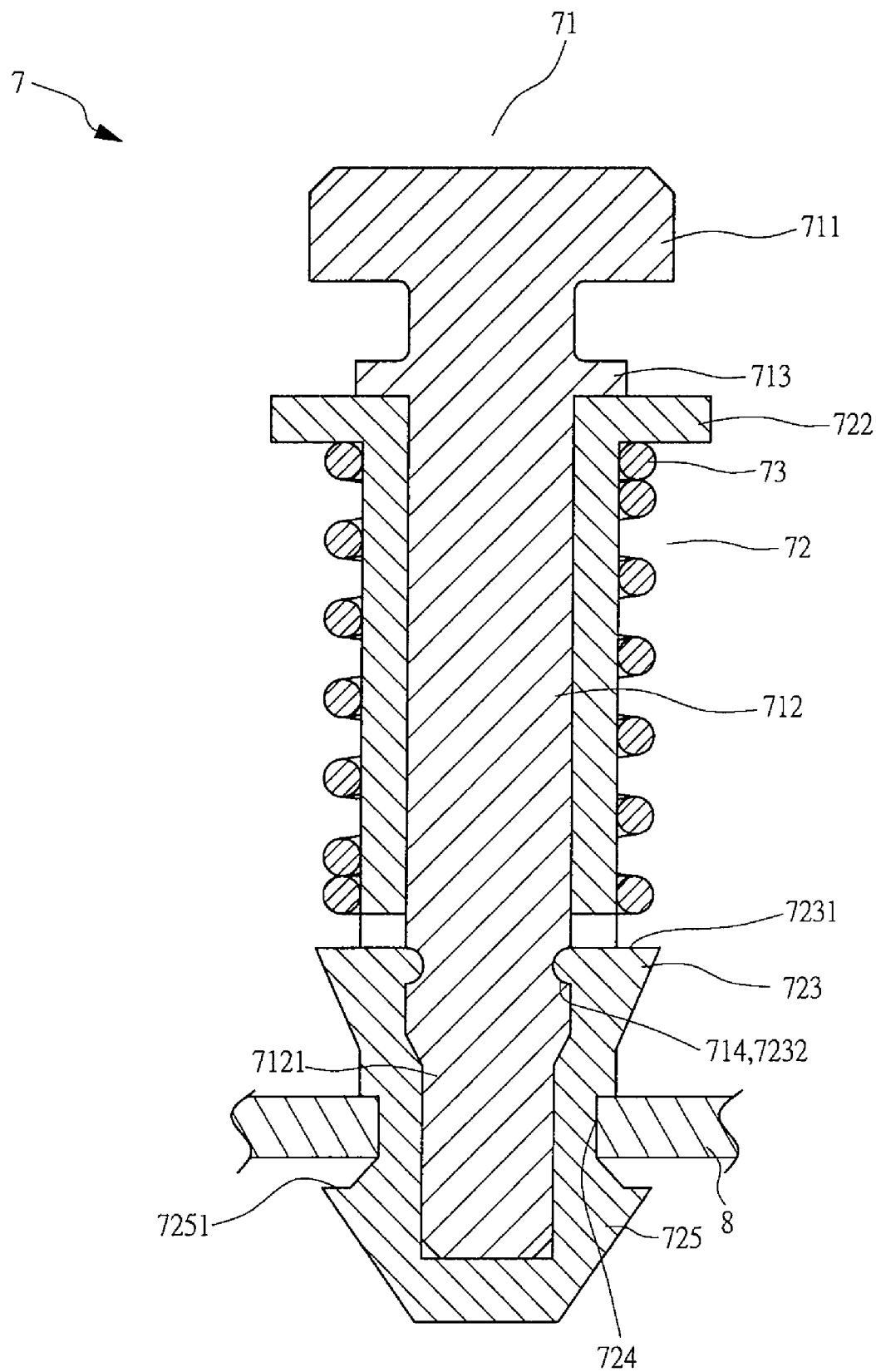
FIG. 9 is a sectional view of the fastener according to a third embodiment of the present invention.
Figure 10:
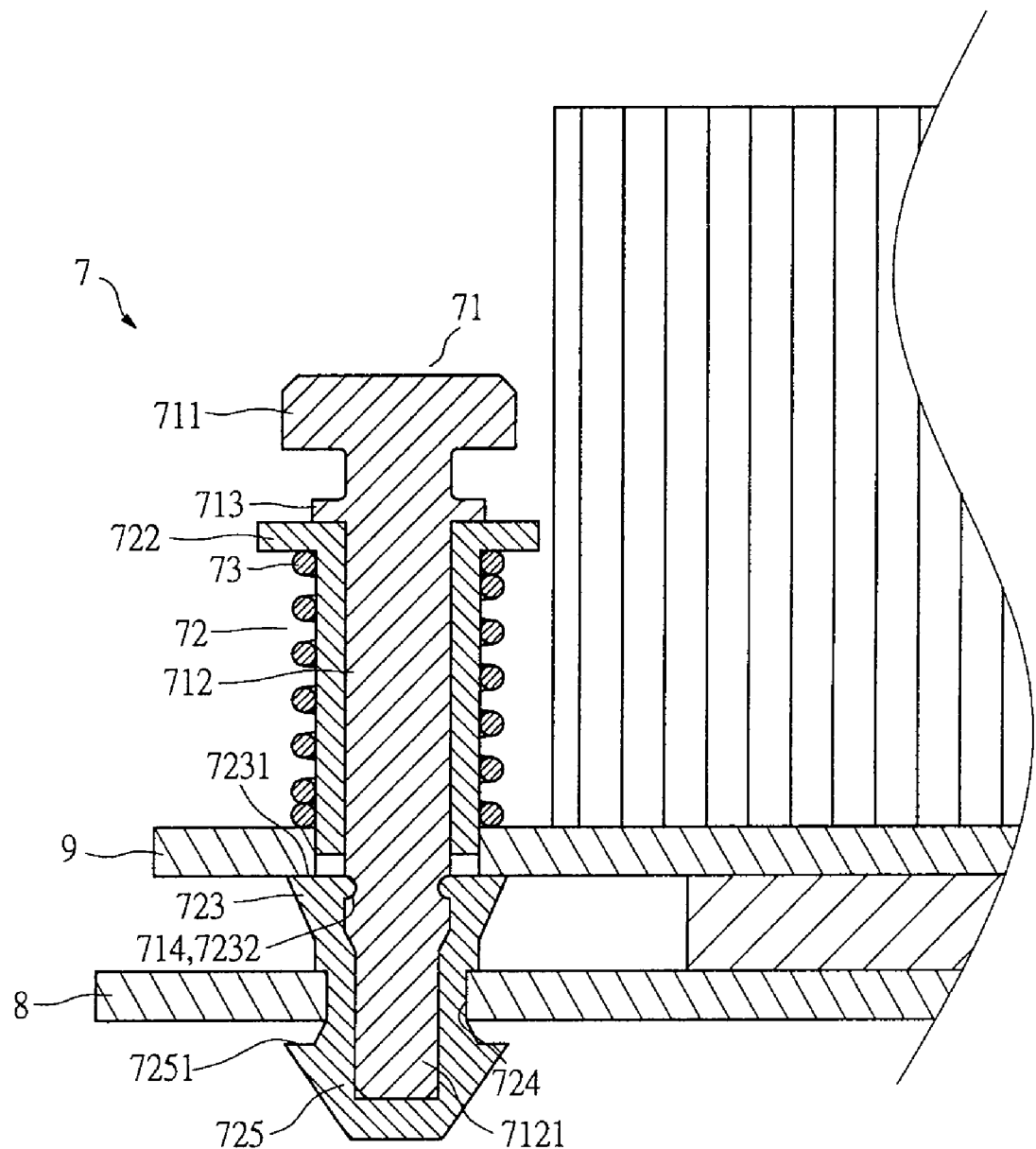
FIG. 10 is a working view of the fastener according to the third embodiment of the present invention.

Referring to FIGS. 9 and 10, there is shown a further embodiment of the present invention. As shown, the second engaging section 725 extends upwardly to form a hook portion 7251. When the sleeve 72 is inserted into the hole of the CPU 8 and the heat sink 9, the engaging recess 724 of the sleeve 72 will be engaged with the hole of the CPU 8. The first engaging member 723 of the sleeve 72 uses its resiliency to pass through the hole of the heat sink 9 to position between the CPU 8 and the heat sink 9. The bearing section 7231 of the first engaging member 723 bears against the bottom of the heat sink 9 and the resilient member 73 is fitted between the heat sink 9 and the flange 722 of the sleeve 72. By means of the resiliency of the resilient member 73, the sleeve 72 will exert a force on the CPU 8 and the heat sink 9. Then, the rod 71 is inserted into the through hole 721 from the opening at the top of the flange 722 of the sleeve 72. When the rod 71 is forced to go downwardly, the rod body 712 of the rod 71 will easily go into the hole 721 of the sleeve 72. When the pressing section 711 of the rod 71 is pressed, the protuberance 7232 of the first engaging member 723 of the sleeve 72 will be engaged with the circular engaging groove 714 of the rod 71 and the CPU 8 will be engaged with the second engaging member 725 of the sleeve 72. By means of the second portion 7121 of the rod body 712, the lower end of the sleeve 72 will be forced to expand outwardly thereby firmly positioning the sleeve 72 and thereby preventing the rod 71 from disengaging from the sleeve 72. As a consequence, the CPU 8 and the heat sink 9 can be joined together. By means of the hook portion 7251, the rod 71 will be prevented from disengaging from the sleeve 72 though subject to the vibration produced in the operation of the CPU 8.

In conclusion, the fastener for heat sinks according to the present invention can clearly achieve the declared objects and functions.

The invention claimed is:

1. A fastener for heat sinks, said fastener comprising:
   a rod including
      a pressing section, and
      a rod body which extends downwardly from the pressing section, said rod body having a first engaging member thereon; and
   a sleeve including
      opposite upper and lower ends,
      a bore that extends downwardly from the upper end of the sleeve toward the lower end of the sleeve,
      a second engaging member engageable with the first engaging member when the rod body is inserted into the bore to prevent said rod from detaching from said sleeve, and
      a third engaging member at the lower end of the sleeve and below the second engaging member for engaging a substrate;
   wherein
   the lower end of the sleeve is deformable to be passable through a through hole in the substrate;
   when the rod body is inserted into the bore with the first and second engaging members engaging each other, the rod body maintains the lower end of the sleeve in an expanded configuration for causing the third engaging member to engage the substrate and preventing the sleeve from detaching from the substrate;
   said first engaging member comprises a circular groove on a lower part of the rod body;
   the upper end of the sleeve comprises a flange; and
   the lower end of the sleeve comprises
      a bearing section having a protuberance at an inner side to define the second engaging member corresponding to said circular groove,
      an engaging recess defining the third engaging member, and
      a gradually decreasing conical member below said engaging recess.

2. The fastener for heat sinks as claimed in claim 1, wherein said engaging recess has opposite slots at two sides.

3. The fastener for heat sinks as claimed in claim 1, further comprising a resilient member fittable over an outer side of said sleeve.

4. The fastener for heat sinks as claimed in claim 1, wherein said third engaging member comprises a hook portion.

5. A fastener for heat sinks, said fastener comprising:
   a rod including
      a pressing section, and
      a rod body which extends downwardly from the pressing section, said rod body having a first engaging member thereon; and
   a sleeve including
      opposite upper and lower ends,
      a bore that extends downwardly from the upper end of the sleeve toward the lower end of the sleeve,
      a second engaging member engageable with the first engaging member when the rod body is inserted into the bore to prevent said rod from detaching from said sleeve,
      a third engaging member at the lower end of the sleeve and below the second engaging member for engaging a substrate; and
      a fourth engaging member above the third engaging member for engaging a heat sink;
   wherein
   the third engaging member at the lower end of the sleeve is elastically deformable, said third engaging member in a relaxed state is larger than a first through hole in the substrate, and said third engaging member is inwardly flexible to be passable through the first through hole and then returnable toward the relaxed state for engaging the substrate from below and temporarily fixing the sleeve relative to the substrate before the rod body is inserted into the bore;
   the fourth engaging member is elastically deformable, said fourth engaging member in a relaxed state is larger than a second through hole in the heat sink, and said fourth engaging member is inwardly flexible to be passable through the second through hole and then returnable toward the relaxed state for engaging the heat sink from below and temporarily fixing the sleeve relative to the heat sink before the rod body is inserted into the bore; and
   when the rod body is inserted into the bore with the first and second engaging members engaging each other, the rod body maintains the third engaging member at the lower end of the sleeve in an expanded configuration for causing the third engaging member to engage the substrate from below and preventing the sleeve from detaching from the substrate.

6. The fastener of claim 5, wherein
the lower end of the sleeve further comprises an engaging recess receivable in the first through hole in the substrate; and
the third engaging member comprises a gradually decreasing conical member below said engaging recess.

7. The fastener of claim 6, further comprising a resilient member fittable over an outer side of said sleeve;
said sleeve further comprising a flange above both said third and fourth engaging members and engageable with the resilient member from above for compressing the resilient member downward against the heat sink.

8. The fastener of claim 7, wherein:
said first engaging member comprises an annular groove on a lower part of the rod body; and
the fourth engaging member comprises, on an inner wall of the sleeve, a protuberance defining the second engaging member corresponding to said annular groove.

9. The fastener of claim 8, wherein said engaging recess has opposite slots.

10. The fastener of claim 8, wherein said third engaging member comprises a hook portion.

11. The fastener of claim 5, further comprising a resilient member fittable over an outer side of said sleeve;
said sleeve further comprising a flange above both said third and fourth engaging members and engageable with the resilient member from above for compressing the resilient member downward against the heat sink.

12. The fastener of claim 5, wherein when the first and second engaging members engage each other, the rod is prevented from moving relative to said sleeve both upwardly and downwardly.

13. The fastener of claim 5, wherein:
said first engaging member comprises a circular groove on an upper part of the rod body;
the upper end of the sleeve comprises, on an inside thereof, lugs defining the second engaging member corresponding to said circular groove;
the lower end of the sleeve further comprises an engaging recess receivable in the first through hole in the substrate; and
the third engaging member comprises a gradually decreasing conical member below said engaging recess.

14. The fastener for heat sinks as claimed in claim 13, wherein said rod body is a member which extends downwardly to form three gradually decreasing sections.

15. The fastener for heat sinks as claimed in claim 13, wherein said engaging recess has opposite slots.

16. The fastener for heat sinks as claimed in claim 13, wherein an inner wall of said bore of said sleeve comprises at least three projections for guiding the rod inside the bore.

17. The fastener for heat sinks as claimed in claim 13, further comprising a resilient member fittable over an outer side of said sleeve;
said sleeve further comprising a flange engageable with the resilient member from above for compressing the resilient member downward against the heat sink.

18. In combination, a substrate having a first through hole, a heat sink, having a second through hole, and a fastener for fastening the heat sink to the substrate, said fastener comprising:
a rod including
a pressing section, and
a rod body which extends downwardly from the pressing section, said rod body having a first engaging member thereon; and
a sleeve including
opposite upper and lower ends,
a bore that extends downwardly from the upper end of the sleeve toward the lower end of the sleeve,
a second engaging member engageable with the first engaging member when the rod body is inserted into the bore to prevent said rod from detaching from said sleeve,
a third engaging member at the lower end of the sleeve and below the second engaging member for engaging the substrate; and
a fourth engaging member above the third engaging member for engaging the heat sink;
wherein
the third engaging member at the lower end of the sleeve is elastically deformable, said third engaging member in a relaxed state is larger than the first through hole in the substrate, and said third engaging member is inwardly flexible to be passable through the first through hole and then returnable toward the relaxed state for engaging the substrate from below and temporarily fixing the sleeve relative to the substrate before the rod body is inserted into the bore;
the fourth engaging member is elastically deformable, said fourth engaging member in a relaxed state is larger than the second through hole in the heat sink, and said fourth engaging member is inwardly flexible to be passable through the second through hole and then returnable toward the relaxed state for engaging the heat sink from below and temporarily fixing the sleeve relative to the heat sink before the rod body is inserted into the bore; and
when the rod body is inserted into the bore with the first and second engaging members engaging each other, the rod body maintains the third engaging member at the lower end of the sleeve in an expanded configuration for causing the third engaging member to engage the substrate from below and preventing the sleeve from detaching from the substrate.

19. The combination of claim 18, wherein
the lower end of the sleeve further comprises an engaging recess receivable in the first through hole in the substrate; and
the third engaging member comprises a gradually decreasing conical member below said engaging recess.

20. The combination of claim 18, wherein
the fastener further comprises a resilient member fittable over an outer side of said sleeve; and
said sleeve further comprises a flange above both said third and fourth engaging members and engageable with the resilient member from above for compressing the resilient member downward against the heat sink.

* * * * *